US007716036B2

(12) United States Patent
Musselman

(10) Patent No.: US 7,716,036 B2
(45) Date of Patent: May 11, 2010

(54) METHOD AND APPARATUS TO USE CLOCK BURSTING TO MINIMIZE COMMAND LATENCY IN A LOGIC SIMULATION HARDWARE EMULATOR / ACCELERATOR

(75) Inventor: Roy Glenn Musselman, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 1911 days.

(21) Appl. No.: 10/422,189

(22) Filed: Apr. 24, 2003

(65) Prior Publication Data

US 2004/0215442 A1 Oct. 28, 2004

(51) Int. Cl.
*G06F 9/455* (2006.01)

(52) U.S. Cl. .............................. 703/28; 703/27; 703/14; 703/17; 703/24

(58) Field of Classification Search .................. 714/28; 710/57, 305; 703/23, 27; 365/182; 716/4–5; 711/4, 167
See application file for complete search history.

(56) References Cited

U.S. PATENT DOCUMENTS

| | | | | | |
|---|---|---|---|---|---|
| 4,613,954 | A | * | 9/1986 | Sheth ........................... | 710/57 |
| 4,975,869 | A | * | 12/1990 | Ammann et al. .............. | 714/28 |
| 5,177,440 | A | * | 1/1993 | Walker et al. ................ | 714/736 |
| 5,438,674 | A | * | 8/1995 | Keele et al. .................... | 711/4 |
| 5,657,442 | A | * | 8/1997 | Groves ......................... | 714/28 |
| 5,684,721 | A | * | 11/1997 | Swoboda et al. .............. | 703/23 |
| 5,768,626 | A | * | 6/1998 | Munson et al. ................ | 710/57 |
| 5,959,881 | A | * | 9/1999 | Trimberger et al. ......... | 365/182 |
| 6,453,278 | B1 | * | 9/2002 | Favor et al. .................... | 703/27 |
| 6,581,191 | B1 | * | 6/2003 | Schubert et al. ................ | 716/4 |
| 6,608,628 | B1 | * | 8/2003 | Ross et al. .................. | 345/619 |
| 6,748,507 | B2 | * | 6/2004 | Kawasaki et al. ........... | 711/167 |

(Continued)

OTHER PUBLICATIONS

John Hillburn and Paul Julich. Microcomputers/Microprocessors: Hardware, Software, and Applications. Prentice-Hall, Inc., 1976. ISBN 0-13-580969-X.*

(Continued)

*Primary Examiner*—Kamini S Shah
*Assistant Examiner*—Cuong V Luu
(74) *Attorney, Agent, or Firm*—James R. Nock

(57) ABSTRACT

The present invention utilizes clock bursting to minimize command latency in a logic simulation hardware emulator/accelerator. The emulator/accelerator includes an emulator system having logic gate functions representing a design under test. The logic gate functions further include special burst clock logic for toggling a clock signal to a plurality of latches within the design under test for a predefined number of clock cycles. A host workstation, coupled to the emulator system by a high-speed cable, provides control for the emulator system. In normal operation, the host workstation encodes a predefined number of clock cycles for the emulator to run, then transmits the encoded number of cycles to the burst clock logic via the high-speed cable. The host workstation then generates a trigger signal within the high-speed cable, which directs the burst clock logic to read and decode the predefined number of cycles and begin toggling the clock signal.

16 Claims, 5 Drawing Sheets

U.S. PATENT DOCUMENTS

| | | | |
|---|---|---|---|
| 2002/0041535 A1* | 4/2002 | Ryan | 365/230.04 |
| 2002/0188664 A1* | 12/2002 | Hultgren et al. | 709/203 |
| 2003/0225565 A1* | 12/2003 | Garcia et al. | 703/23 |
| 2004/0123258 A1* | 6/2004 | Butts | 716/5 |
| 2005/0165995 A1* | 7/2005 | Gemelli et al. | 710/305 |
| 2006/0034275 A1* | 2/2006 | Roberts et al. | 370/389 |

OTHER PUBLICATIONS

William Deem, Kenneth Muchow, and Anthony Zeppa. Digital Computers Circuits and Concepts.Reston Publishing Company, Inc.1974. ISBN 0-87909-193-2.*

* cited by examiner

METHOD AND APPARATUS TO USE CLOCK BURSTING TO MINIMIZE COMMAND LATENCY IN A LOGIC SIMULATION HARDWARE EMULATOR / ACCELERATOR

FIELD OF THE INVENTION

The present invention relates generally to logic simulation hardware emulation, and more specifically to using clock bursting to minimize command latency in a logic simulation hardware emulator/simulation accelerator.

BACKGROUND OF THE INVENTION

Design verification is essential to virtually any very large scale integration (VLSI) design project. One of the popular verification methods is logic simulation. Logic simulation software reports on how a circuit under design responds to a sequence of input vectors, so the designer can judge whether the circuit behaves as expected over the input sequence. The more vectors simulated, the greater confidence the designer has in the correctness of the designing circuit.

As circuit complexity increases and the time to market shortens, inadequate simulation speed becomes a major bottleneck in the design process. As a result, several special purpose machines have been built to simulate/emulate complex logic designs in hardware, rather than software. Such emulation/acceleration devices can provide several orders of magnitude of speed improvement during the simulation/emulation process. Thus, the necessity and usefulness of emulation/acceleration devices has increased enormously with growth in the complexity of integrated circuits.

An emulation/acceleration engine operates to mimic the logical design of a set of one or more integrated circuit chips. The emulation of these chips in terms of their logical design is highly desirable for several reasons which are discussed in more detail below. It is, however, noted that the utilization of emulation/acceleration engines has also grown up with and around the corresponding utilization of design automation tools for the construction and design of integrated circuit chip devices. In particular, as part of the input for the design automation process, logic descriptions of the desired circuit chip functions are provided. The existence of such software tools for processing these descriptions in the design process is well mated to the utilization of emulation/acceleration engines which are electrically configured to duplicate the same logic function that is provided in a design automation tool.

Utilization of emulation/acceleration devices permits testing and verification, via actual electrical circuits, of logical designs before these designs are committed to a so-called "silicon foundry" for manufacture. The input to such foundries is the functional logic description required for the chip, and its output is initially a set of photolithographic masks which are then used in the manufacture of the desired electrical circuit chip devices. However, it is noted that the construction of such masks and the initial production of circuit chips, which operate in accordance with the designed for functional logic requirements, is expensive. Any passage of a given device having the prescribed logic functionality though such a foundry is an expensive and time consuming process which clearly should be undertaken only once. It is the purpose of emulation/acceleration engines to ensure such a single passage from the functional logic design stage through the stage of chip production via such a foundry.

Verifying that logic designs are correct before committing a design to manufacturing, therefore, eliminates the need for costly and time-consuming multiple passes through a silicon foundry. Debugging logic errors deep inside a logic chip can be extremely difficult because of very limited observability. Emulation provides two very significant advantages. Firstly, the proper verification of a functional logic design eliminates the need for a second costly passage through the foundry, and, secondly, and just as importantly, getting the design "right the first time" means that the design does not have to be corrected in the foundry. Accordingly, production delays are significantly reduced and the time to market for the particular technology/technology improvements embedded in the integrated circuit chip is greatly reduced, thus positively impacting the ability to deliver the most sophisticated technological solutions to consumers in as short of time as possible.

An additional advantage that emulation/acceleration systems have is that they act as a functioning system of electrical circuits which makes possible the early validation of software which is meant to operate the system that the emulator/accelerator is mimicking. Thus, software can be designed, evaluated and tested well before the time when the system is embodied in actual circuit chips. Additionally, emulation/acceleration systems can also operate as simulator-accelerator devices thus providing a high speed simulation platform.

FIG. 1A illustrates a high-level block diagram of a typical emulation/acceleration system 10 (hereinafter referred to as emulation system 10), which is controlled by a host workstation 12. Emulation system 10 includes at least one emulation board 14, which, in turn, contains a plurality of emulation modules 16, as shown in FIG. 1B. Each emulation module 16 contains a plurality of emulation processors 18, as shown in FIG. 1C. Each emulation processor 18 is programmed to evaluate a particular logic function (for example, AND, OR, XOR, NOT, NOR, NAND, etc.). The programmed emulation processors 18, together as a connected unit, emulate the entire desired logic design under test 19 (i.e., the programmed emulation processors form part of a simulation "model" 15 for the logic design). This simulation model 15 may also include some additional controllability/observability logic to aid in the simulation/emulation process.

The overall simulation throughput of such a system is limited by the interface between the simulation model running on the emulation system 10 and a control program 20 running on a host workstation 12. Transactions between control program 20 and the emulation board 14 include reading and writing the values of logic facilities contained within the simulation model and the execution of cycles to recalculate the model state by toggling the value of clock signals that propagate to latch facilities within the simulation model.

The propagation of a "clock" command from control program 20 to emulation system clock distribution circuitry 24 through a normal network interface 26 incurs a substantial latency, particularly if the number of cycles specified by the "clock" command is low, and the speed of emulation system 10 is high.

In order to address this shortcoming, some systems provide an alternate communication path between control program 20 and the emulation board 14 that bypasses normal network interface 26. This path includes a custom stimulus card 28 (e.g., Cadence Design System's Direct Access Stimulus "DAS" card) plugged into a PCI slot in host workstation 12. A special high-speed multi-strand cable 30 is connected between custom stimulus card 28 and the emulation board 14 containing the model. This cable 30 is much more efficient than the network interface 26 because of the more direct connection. To use this cable 30 most efficiently, a single "cycle forever" command is issued from control program 20 to emulation board 14 via network interface 26. Emulation system 10 then continuously evaluates the model state. Read and write accesses from control program 20 through custom stimulus card 28 then directly accesses the model facilities as they are being evaluated.

In order to keep control program 20 synchronous with the evaluation of the emulation model, precise control of the clocking signals to all latches within the model is required. In order to prevent an undesired change in model state, the clock signals should be disabled while the emulation system 10 is cycling. This condition where in the emulator is cycling but the model is prohibited from changing state is known as "idling". Clock signals should be enabled for the precise number of emulator cycles in order to allow the model to change state. In one implementation, one of the signals on cable 30 is assigned to a clock signal that, when toggled, produces a 1-emulator-cycle pulse in the model, advancing the model to the next sequential state. Control program 20 then executes a loop that toggles the clock signal for the required number of cycles.

While this technique provides an improvement over the network interface 26 method of clocking, it still does not provide optimum obtainable throughput. There is a need for an enhanced apparatus and method for controlling the clock inputs to all latches within the simulation model. Such an apparatus should reside within the emulation board 14, so that work previously performed by a clock control loop in control program 20 is now performed by logic within the emulation board 14 itself.

SUMMARY OF THE INVENTION

The present invention provides a logic simulation hardware emulator. The hardware emulator includes an emulation system having one or more emulation boards, each board having logic gate functions. These logic gate functions include a design under test, and burst clock logic for toggling a clock signal to a plurality of latches within the design under test for a predefined number of cycles. The hardware emulator further includes a host workstation coupled to the emulation system by a high speed cable. The host workstation includes a control program for controlling the emulation system, wherein the control program encodes the predefined number of cycles, then transmits the encoded predefined number of cycles to the burst clock logic via the high-speed cable.

In one embodiment of the present invention, the control program is coupled to the high-speed cable via a custom stimulus card plugged into the host workstation. A plurality of signals within the high-speed cable interface are used to deliver the encoded predefined number of cycles from the high-speed interface cable into the burst clock logic. A trigger signal within the high-speed cable interface is used to load the encoded predefined number of cycles from the control program into the burst clock logic. The trigger signal causes a logic clock enable signal generated by the burst clock logic to go from a first (e.g., inactive) state to a second (e.g., active) state for the predefined number of cycles. In one embodiment, this is done by decrementing the predefined number of cycles within the burst clock logic, driving the clock enable signal generated by the burst clock logic to the second state until the predefined number of cycles is decremented to zero. When the predefined number of cycles reaches zero, the logic clock enable signal returns to the first state, and a done signal is returned to the control program on the host workstation via the high-speed cable. The logic clock enable signal generated by the burst clock logic serves to control the clock inputs to all latches within the design under test. More specifically, a multiplexer is inserted before every latch in the design under test, and the logic clock enable signal acts a selector for the multiplexer, enabling data and model clock information to be latched by the design under test when the logic clock enable signal is at the second state. In one embodiment of the present invention, the design under test and the burst clock logic are incorporated within a compiled simulation model residing within the logic gate functions on the emulation board(s).

The present invention also provides a method for controlling the clock input to all latches within a design under test in a logic simulation hardware emulator. The logic simulation hardware emulator includes an emulation system coupled to a host workstation by a high-speed interface cable. The method begins by the host workstation encoding a predetermined number of clock cycles to run the emulation system. Next the encoded predetermined number of clock cycles is transmitted on one or more signals within the high-speed interface cable. Then a trigger signal is sent on the high-speed interface cable to capture the encoded predetermined number of clock cycles on the high-speed interface cable into burst clock logic within the emulation system. Next the encoded predetermined number of clock cycles is decoded within the burst clock logic, and a clock enable signal is enabled for the predetermined number of clock cycles. In a preferred embodiment, the predetermined number of clock cycles is decremented within the burst clock logic while simultaneously enabling a clock enable signal for the predetermined number of clock cycles. In an alternate embodiment, an internal counter within the burst clock logic is incremented up to the predetermined number of clock cycles while simultaneously enabling a clock enable signal for the predetermined number of clock cycles.

In one embodiment of the present invention, the method further includes the step of enabling the latches within the design under test to change based on a model clock signal and a data signal for each latch for the period of time the clock enable signal is enabled by the burst clock logic. In one embodiment, the method further includes a step of disabling the clock enable signal, and enabling a done signal to notify the control program that the burst operation has completed, if the decremented number of clock cycles reaches zero within the burst clock logic.

DETAILED DESCRIPTION OF THE PREFERRED EMBODIMENTS

Figure 1A:
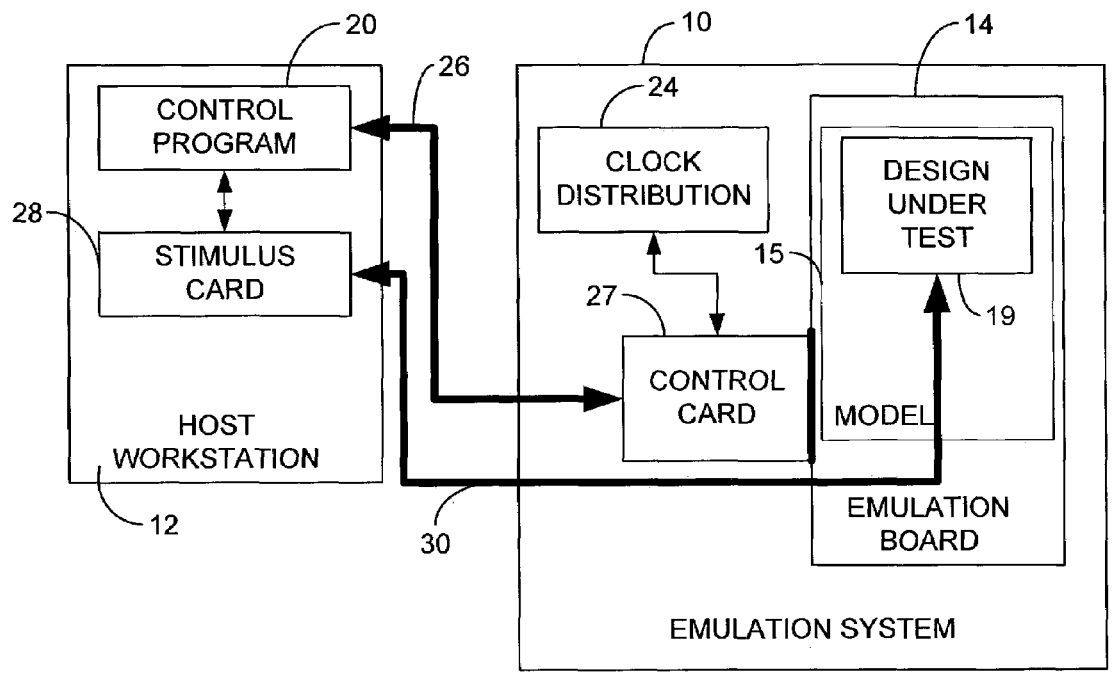
FIG. 1A (Prior Art) is a high-level block diagram of a typical logic emulation system controlled by a host workstation.
Figure 1B:
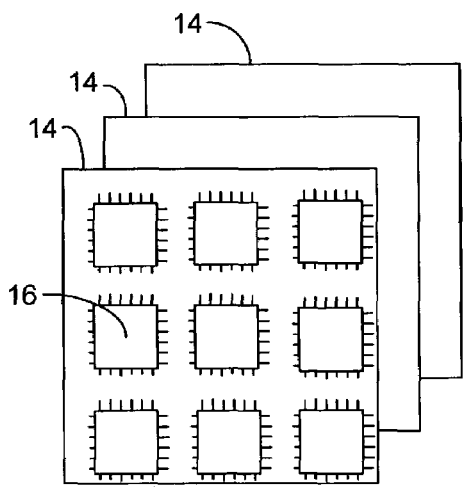
FIG. 1B (Prior Art) is a representation of an emulation board from the logic emulation system of FIG. 1A where the emulation board contains a plurality of emulation modules.
Figure 1C:
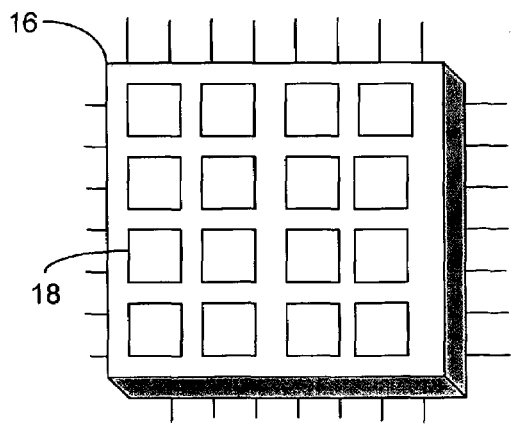
FIG. 1C (Prior Art) is a close-up view of an emulation module, previously illustrated in FIG. 1B, wherein the emulation module contains a plurality of emulation processors.
Figure 2:
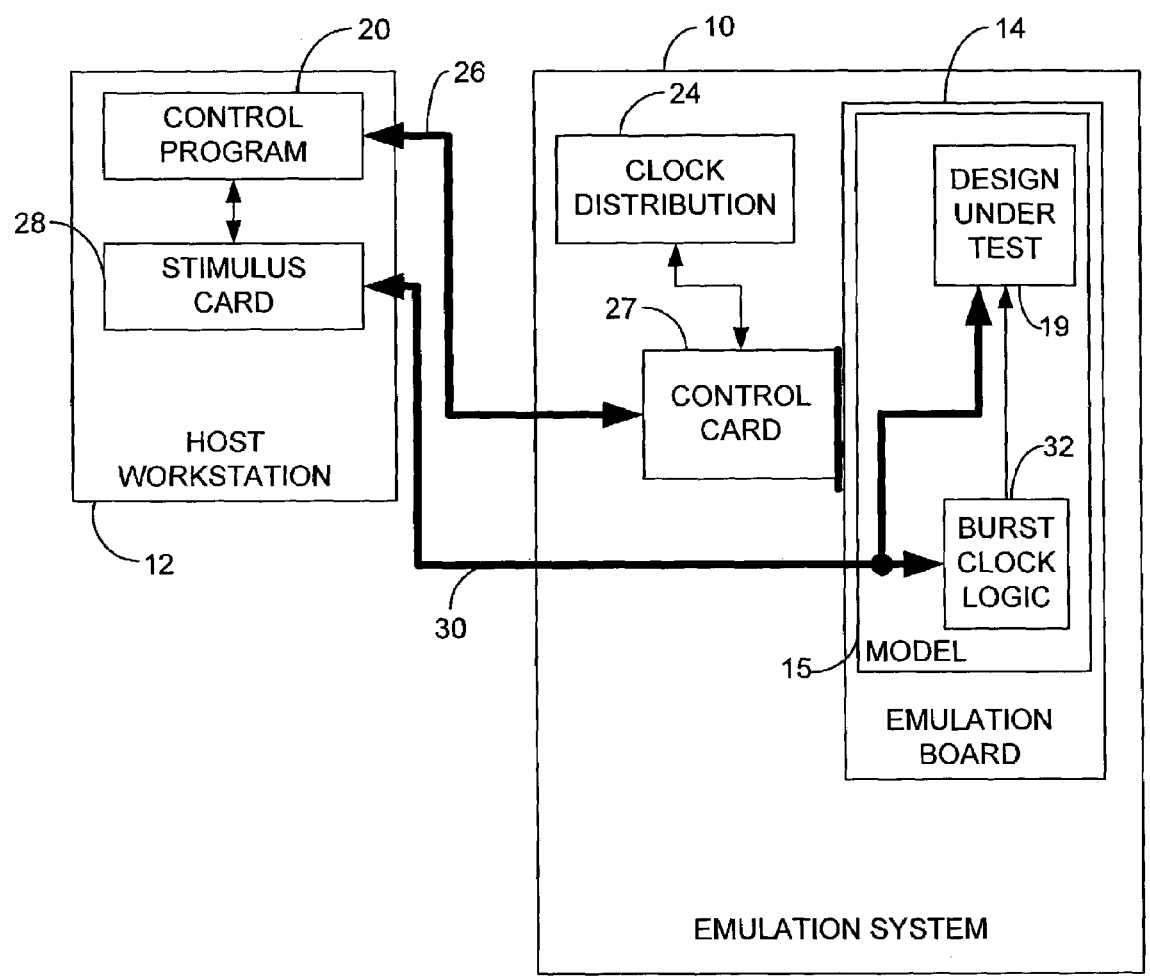
FIG. 2 is a block diagram of a logic emulation system in accordance with the present invention, wherein the simulation model includes burst clock logic to enhance the performance of the logic emulation system.

Turning to the Drawings, wherein like numbers denote like parts throughout the several views, FIG. 2 is a block diagram of a logic emulation system 10 controlled by a host workstation 12 in accordance with the present invention. Logic emulation system 10 includes one or more emulation boards 14 having logic gate functions incorporating a compiled simulation model 19. In a preferred embodiment of the present invention, the simulation model 15 not only includes the design under test 19 and some supporting logic, but also new, additional logic which enhances the performance of logic emulation system 10. This additional logic (i.e., burst clock logic 32) incorporated (i.e., compiled) within the model controls the clock inputs to all latches within the design under test 19 portion of the model. In an alternate embodiment of the present invention (not illustrated), burst clock logic 32 may reside elsewhere within emulation system 10 (e.g., within clock distribution module 24). In another alternate embodiment of the present invention (not illustrated), burst clock logic may reside as a separate circuit entity on emulation board 14.

In the preferred embodiment, instead of using only one signal on cable 30 to deliver a single clock signal as seen in the prior art, several signals are used within cable 30 to deliver an encoded value of the number of cycles to run along with a single signal to trigger the execution of a burst of clock pulses equal to the number of cycles specified.

Burst clock logic 32 within model 15 then detects the change in the trigger signal, captures the value available on the number-of-cycles signals, then turns on the clock enable signals for the specified number of emulation cycles. This invention provides a significant advantage over prior art systems in that the work previously performed by a loop in the control program 20 is now being done by decrementor logic (i.e., the burst clock logic 32) within the model itself. Thus, the repeated toggling of a single clock signal by control program 20 is replaced by the single setting of the multiple bit cycle count followed by a single toggle of the trigger signal. This technique dramatically improves performance depending on the number of cycles to be run during the burst.

Figure 3:
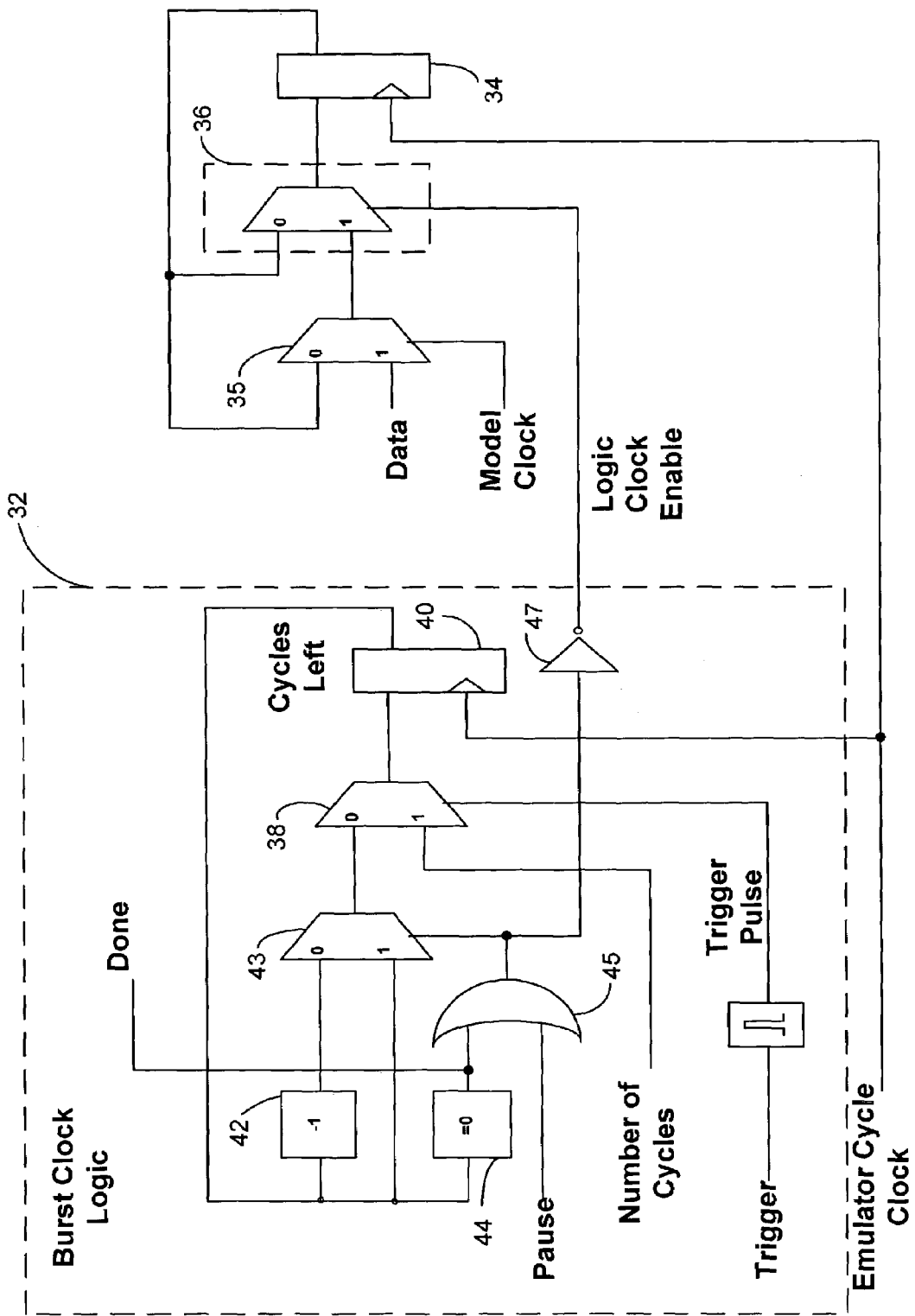
FIG. 3 is a logic diagram of one embodiment of burst clock logic in accordance with the present invention, and how the burst clock logic connects to the latches of the design under test.

FIG. 3 is a logic diagram of one embodiment of burst clock logic 32 in accordance with the present invention, and how the burst clock logic 32 connects to the latches 34 of the design under test 19. The signals within the logic diagram are defined as follows. The "Emulator Cycle Clock" signal is controlled by the emulator clock subsystem and is effectively continuously enabled by the "cycle forever" command, even during idle mode. An additional multiplexer 36 is inserted before all latches 34 in the design under test 19. If the "Logic Clock Enable" signal is turned off (i.e., is equal to zero), all latches 34 within design under test 19 will latch up their current contents, thus not changing value. The "Trigger" and "Number of Cycles" signals come from cable 30. The value of the "Done" signal is sent back to control program 20 via cable 30. The "Pause" signal is optional and can be delivered from the cable 30, or can be derived from other signals in the model.

As discussed previously, "Emulator Cycle Clock" is continuously enabled by control program 20, and provides clocking for latch 40 within burst clock logic 32 and for all latches 34 within the design under test 19. Control program 20 encodes the "Number of Cycles" signal with a number of clock cycles to run the emulator. This "Number of Cycles" value is selected into burst clock logic 32 by the "Trigger" signal on multiplexer 38. At this point, the "Number of Cycles" value becomes the number of remaining cycles for the burst clock logic. This number of remaining cycles is then passed to latch 40 where the value is latched by the continuously cycling "Emulator Cycle Clock" signal.

If the latched remaining number of cycles is greater than zero, the remaining number of cycles is decremented by one at block 42, and the new decremented remaining number of cycles is passed onto input "0" of multiplexer 43. The non-decremented remaining number of cycles is concurrently passed onto input "1" of multiplexer 43. Thus the selection signal for multiplexer 43 serves to control whether or not the remaining number of cycles value is decremented or left static.

If the latched remaining number of cycles is equal to zero, an enabling signal is passed onto a first input of two-input OR gate 45, and the "DONE" signal goes active, the "DONE" signal being returned to the control program 20. The second input to two-input OR gate 45 is provided by the "Pause" signal.

If either the enabling signal (i.e., the number of remaining cycles is equal to zero) or the "PAUSE" signal goes high, burst clock logic 32 stops decrementing the number of cycles value (i.e., input "1" of multiplexer 43 is sent to multiplexer 38). The output of two-input OR gate 45, is also passed through inverter 47, which provides the selection signal for multiplexer 36 in design under test 19. However, if both the enabling signal and the "Pause" signal are low, the decremented remaining number of cycles left value (i.e., input "0" of multiplexer 43) is passed to multiplexer 38.

While burst clock logic 32 is decrementing the remaining number of cycles value, the "Logic Clock Enable" signal goes active (i.e., goes to a second state) which enables multiplexer 36 to pass "Data" values from multiplexer 35 to latch 34 (i.e., the latches in the design under test 19 are allowed to change). When the "Logic Clock Enable" signal goes inactive (i.e., returns to a first state), latches 34 within the design under test 19 are not able to change.

In an alternative embodiment of burst clock logic (not shown), an internal counter within the burst clock logic is incremented up to the predetermined number of clock cycles while simultaneously enabling a clock enable signal for the predetermined number of clock cycles. It is contemplated that a number of other designs where an encoded, predetermined number of clock cycles is decoded within the burst clock logic, then the burst clock logic enables a clock enable signal for the predetermined number of clock signals are possible, all of such designs remain within the scope and spirit of the present invention.

Figure 4:
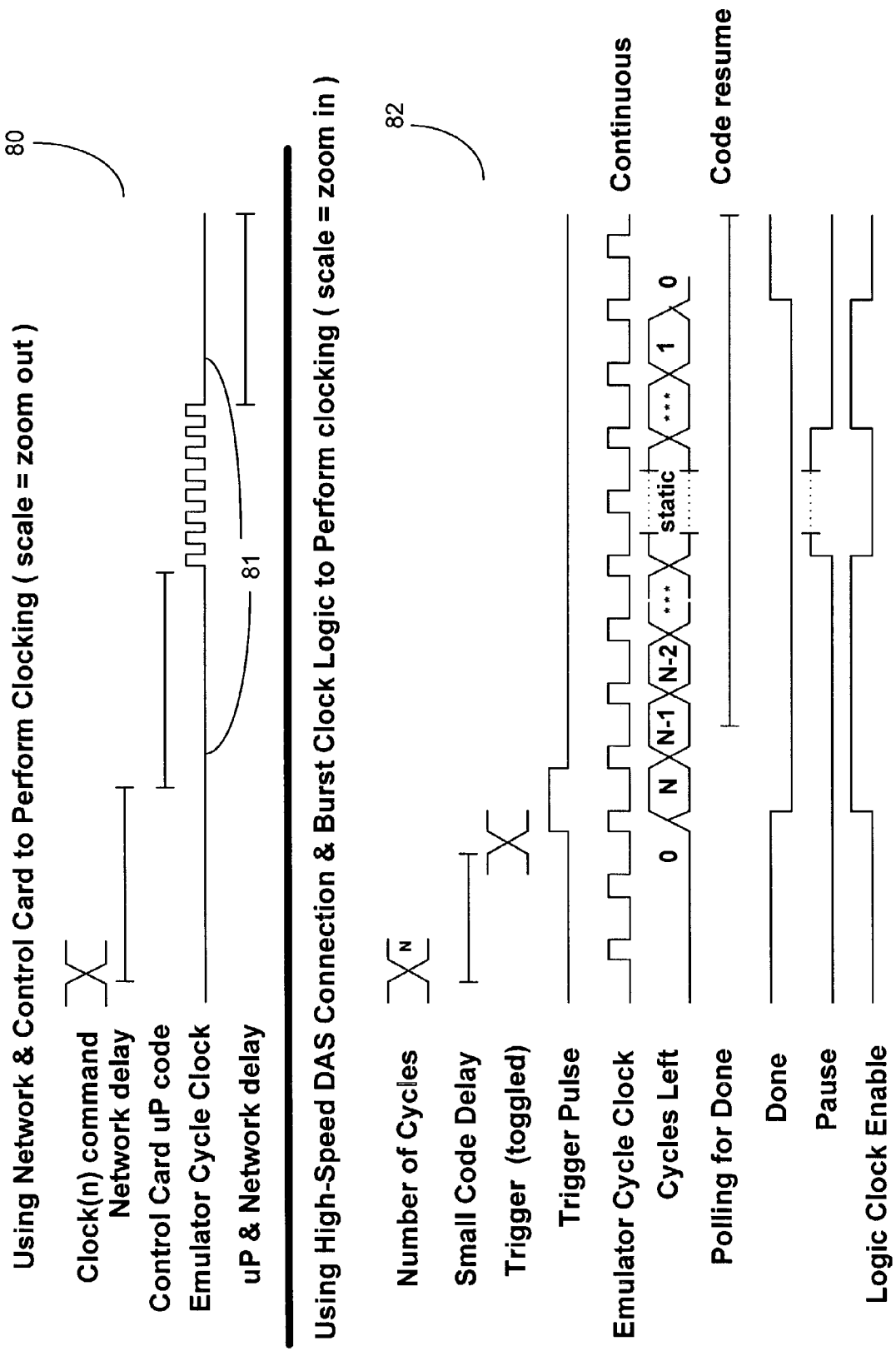
FIG. 4 illustrates two timing diagrams which compare the operation of the clock(n) command performed through the prior art network interface with the same command performed though the custom stimulus card/burst clock logic interface of the present invention.

FIG. 4 illustrates two timing diagrams which compare the operation of the clock(n) command performed through the prior art network interface 26 with the same command performed though the custom stimulus card 28/burst clock logic 32 interface of the present invention. The top diagram 80 illustrates the prior art method of using the network interface 26 and control card 27 to perform the clocking within the design under test 19. The bottom diagram 82 illustrates the method of the present invention to use the high-speed cable 30 and burst clock logic 32 to perform clocking within the design under test 19. The illustrated timing diagrams are not to scale, but are intended to illustrate the differences. Note that in the top network timing diagram 80, there are significant periods of delay before and after the time during which the "Emulator Cycle Clock" signal is actively switching (see element 81).

Note that in bottom diagram 82, "Emulator Cycle Clock" signal is continuously clocking as opposed to enabled for a short period in the network interface mode illustrated in top diagram 80. As illustrated in bottom diagram 82, control program 20 first sets the value of the "Number of Cycles" signals, then toggles the value of the "Trigger" Signal. The burst clock logic 32 then detects the change in the "Trigger" signal (see multiplexer 38, in FIG. 3), and activates the "Trigger Pulse" signal for one emulation cycle. During this cycle, the value of the "Number of Cycles" signal is captured in the "Cycles Left" latch (see latch 40, in FIG. 3).

Since the value of the "Cycles Left" latch is no longer zero, the "Done" signal turns off, the "Logic Clock Enable" signal turns on, and the "Cycles Left" starts to decrement (see decrementor block 42, in FIG. 3). Next, control program 20 enters a loop that polls the "DONE" line on cable 30. Once the "Cycles Left" value reaches zero (see "equals zero" block 44, in FIG. 3), it freezes, at which point the "Done" signal turns back on, and the "Logic Clock Enable" signal turns off.

Next, control program 20 detects the change in the "Done" signal and breaks out of its loop to resume processing. During the time that "Logic Clock Enable" was on, the latches 34 in the design under test were allowed to change, based on the "Model Clock" and the "Data" signals for each latch 34.

Bottom timing diagram 82 also shows the operation of the optional "Pause" signal. When "Pause" is active, the "Cycles Left" value freezes and the "Clock Enable" signal turns off, but the "Done" signal remains off. Once the "Pause" signal turns off, the "logic Clock Enable" signal turns back on and the "Cycles Left" value resumes decrementing.

Figure 5:
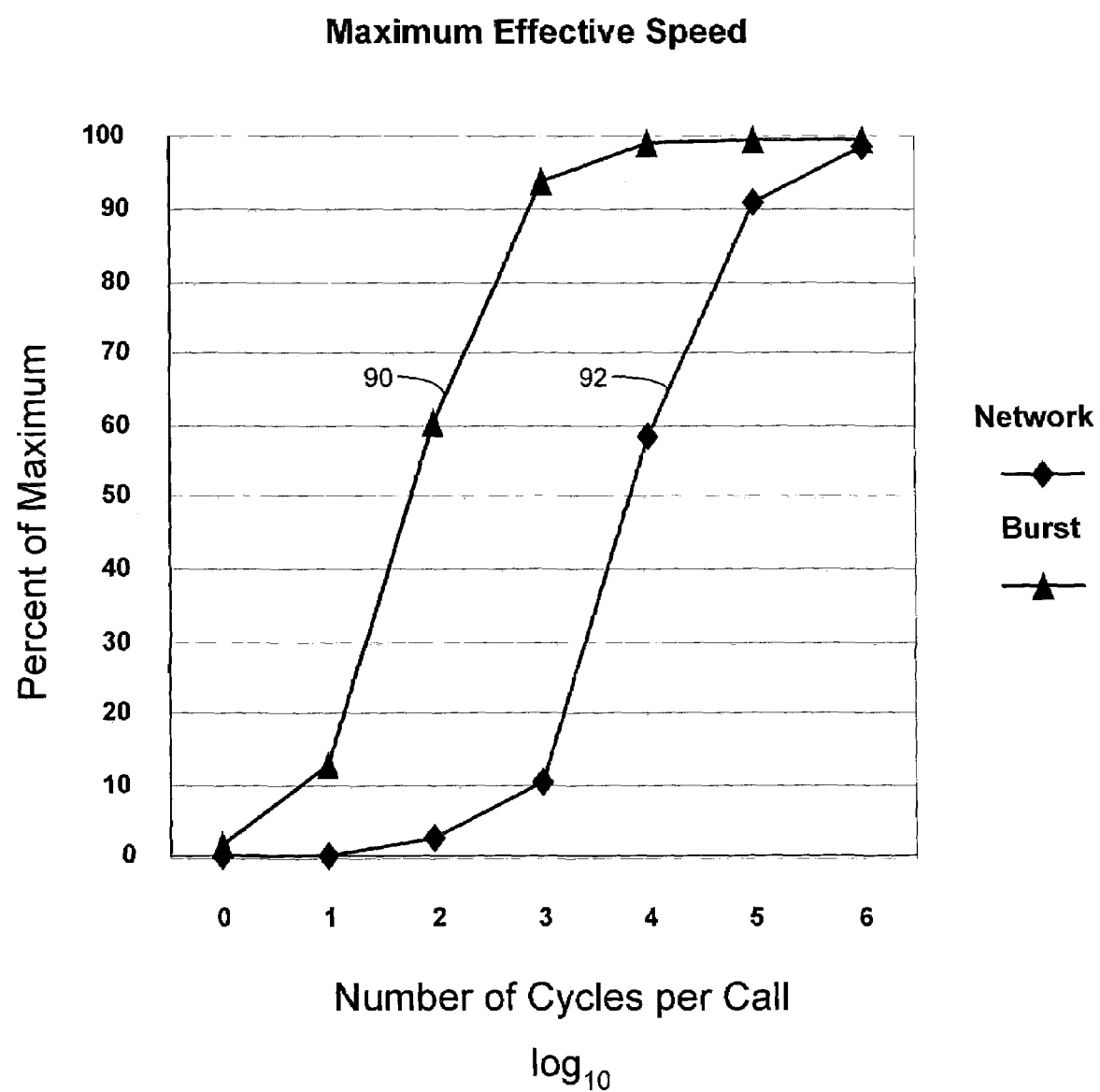
FIG. 5 is a chart comparing the effects of using the clock(n) command performed though the prior art network interface with the same command performed through the custom stimulus card/burst clock interface of the present invention.

FIG. 5 is a chart comparing the effects of using the clock(n) command performed though the prior art network interface with the same command performed through the custom stimulus card/burst clock interface of the present invention. Line 92 represents the performance of prior art method of using network 26 and control card 27 to perform clocking within the design under test. Line 90 represents the performance of the method of the present invention which uses the high-speed cable 30 and burst clock logic 32 to perform clocking within design under test 19.

The X-axis scale is logarithmic, showing only the exponent. Note that the greatest difference between the two methods occurs when the number of cycles is approximately equal to 1000. At this amount, the network interface method 90 can only obtain a speed that is approximately only 10% of maximum obtainable raw emulator cycle clock frequency. Thus, using the burst clock method of the present invention can enable the emulator to reach a speed that is greater than 90 percent of the maximum emulator cycle clock frequency.

The invention in its broader aspects is therefore not limited to the specific details, representative apparatus and method, and illustrative examples shown and described. Accordingly, departures may be made from such details without departing from the spirit or scope of applicants' general inventive concept. It is intended that the scope of the present invention be limited not by this detailed description, but rather by the claims appended hereto. Therefore, the invention lies in the claims hereinafter appended.

What is claimed is:

1. A logic simulation hardware emulator, comprising:
   an emulation system comprising one or more emulation boards having logic gate functions incorporating:
      a design under test; and
      a burst clock logic for toggling a clock signal to a plurality of latches within the design under test for a predefined number of clock cycles; and
   a host workstation coupled to said emulation system by a high-speed cable, the host workstation comprising a control program for controlling the emulation system;
   wherein the control program encodes the predefined number of cycles, then transmits the encoded predefined number of cycles to the burst clock logic via the high-speed cable.

2. The logic simulation hardware emulator of claim 1, wherein the control program is coupled to the high-speed cable via a custom stimulus card plugged into the host workstation.

3. The logic simulation hardware emulator of claim 1, wherein a plurality of signals within the high-speed cable are used to deliver the encoded predefined number of cycles from the control program to the burst clock logic.

4. The logic simulation hardware emulator of claim 3, wherein a trigger signal within the high-speed cable is used to load the encoded predefined number of cycles from the control program into the burst clock logic.

5. The logic simulation hardware emulator of claim 4, wherein the trigger signal causes a logic clock enable signal generated by the burst clock logic to go from a first state to a second state for the predefined number of cycles.

6. The logic simulation hardware emulator of claim 5, wherein the burst clock logic decrements the predefined number of cycles, leaving the clock enable signal generated by the burst clock logic to remain at the second state until the predefined number of cycles is decremented to zero.

7. The logic simulation hardware emulator of claim 6, wherein if the predefined number of cycles is decremented to zero, the logic clock enable signal returns to a first state, and a done signal is returned to the control program on the host workstation via the high-speed cable interface.

8. The logic simulation hardware emulator of claim 5, wherein the burst clock logic increments an internal counter up to the predefined number of cycles, leaving the clock enable signal generated by the burst clock logic to remain at a second state until the internal counter reaches the predefined number of cycles.

9. The logic simulation hardware emulator of claim 8, wherein if the internal counter is incremented up to the predefined number of cycles, the logic clock enable signal returns to a first state, and a done signal is returned to the control program on the host workstation via the high-speed cable.

10. The logic simulation hardware emulator of claim 5, wherein the logic clock enable signal controls the clock inputs to all latches within the design under test.

11. The logic simulation hardware emulator of claim 10, wherein a multiplexer is inserted before every latch in the design under test.

12. The logic simulation hardware emulator of claim 11, wherein the logic clock enable signal acts as a selector for the multiplexer, enabling data and model clock information to be latched by the design under test when the logic clock enable signal is at the second state.

13. The logic simulation hardware emulator of claim 1, wherein the design under test and the burst clock logic are incorporated within a compiled simulation model residing within the logic gate functions.

14. A method for controlling the clock input to all latches within a design under test in a logic simulation hardware emulator, the hardware emulator comprising an emulation system coupled to a host workstation by a high-speed cable, the method comprising the steps of:
   encoding at the host workstation a predetermined number of clock cycles to run the emulation system;

loading the encoded predetermined number of clock cycles into a plurality of signals within the high-speed cable;

sending a trigger signal on the high-speed interface cable to capture the encoded predetermined number of clock cycles on the high-speed cable into a burst clock logic within the emulation system;

decoding the encoded predetermined number of clock cycles within the burst clock logic; and enabling within the burst clock logic a clock enable signal for the predetermined number of clock cycles.

15. The method of claim 14, wherein the method further includes the step of:

enabling the latches within the design under test to change based on a model clock signal and a data signal for each latch for the period of time the clock enable signal is enabled by the burst clock logic.

16. The method of claim 15, wherein the method further includes the step of:

if the decremented number of clock cycles reaches zero, disabling the clock enable signal, and enabling a done signal to notify the control program that the burst operation has completed.

* * * * *